United States Patent
Maruyama

(10) Patent No.: US 10,720,917 B2
(45) Date of Patent: Jul. 21, 2020

(54) SEMICONDUCTOR DEVICE AND METHOD OF GENERATING POWER-ON RESET SIGNAL

(71) Applicant: LAPIS Semiconductor Co., Ltd., Yokohama (JP)

(72) Inventor: Tetsuji Maruyama, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 0 days.

(21) Appl. No.: 15/792,758

(22) Filed: Oct. 25, 2017

(65) Prior Publication Data

US 2018/0123582 A1    May 3, 2018

(30) Foreign Application Priority Data

Oct. 28, 2016 (JP) ................... 2016-211802

(51) Int. Cl.
*H03K 17/22* (2006.01)
*G06F 1/24* (2006.01)
*G06F 1/26* (2006.01)
*H03K 17/20* (2006.01)

(52) U.S. Cl.
CPC ............. *H03K 17/22* (2013.01); *G06F 1/24* (2013.01); *G06F 1/26* (2013.01); *H03K 17/20* (2013.01); *H03K 17/223* (2013.01)

(58) Field of Classification Search
CPC ...... H03K 17/22; H03K 17/223; H03K 17/20; H03K 3/02335; H03K 3/0375; H03K 3/2865; H03K 3/356008; G06F 1/26; G06F 1/24
See application file for complete search history.

(56) References Cited

U.S. PATENT DOCUMENTS

| 7,570,091 B2* | 8/2009 | Sugio ................. G06F 1/24 327/142 |
| 8,742,805 B2* | 6/2014 | Lee ..................... H03L 7/00 327/142 |
| 2018/0131367 A1* | 5/2018 | Schnaitter ........... H03K 17/223 |

FOREIGN PATENT DOCUMENTS

JP    2008-187475    8/2008

* cited by examiner

*Primary Examiner* — Jung Kim
(74) *Attorney, Agent, or Firm* — JCIPRNET

(57) ABSTRACT

A semiconductor device and a method of generating a power-on reset signal are provided. The semiconductor device includes a regulator configured to generate a regulated power supply voltage having a lower voltage value than a power supply voltage based on the power supply voltage and output the regulated power supply voltage to an internal power supply line, and a power-on reset circuit configured to generate a signal which has a first level at which reset is prompted immediately after power for the power supply voltage is turned on and which transitions to a second level at which reset release is prompted from the first level when a voltage value of the internal power supply line has risen as a power-on reset signal.

4 Claims, 4 Drawing Sheets

SEMICONDUCTOR DEVICE AND METHOD OF GENERATING POWER-ON RESET SIGNAL

CROSS-REFERENCE TO RELATED APPLICATION

This application claims the priority benefit of Japanese application serial no. 2016-211802, filed on Oct. 28, 2016. The entirety of the above-mentioned patent application is hereby incorporated by reference herein and made a part of this specification.

BACKGROUND

Technical Field

The disclosure relates to a semiconductor device, for example, a semiconductor device in which a power-on reset circuit is formed and a method of generating a power-on reset signal.

Related Art

In a semiconductor device in which a digital circuit is formed, a power-on reset circuit configured to initialize a state of the digital circuit in response to power-on is provided. As such a power-on reset circuit, a configuration in which an externally supplied power supply voltage is delayed by an RC circuit including a resistor and a capacitor, and a signal obtained by binarizing the voltage by an inverter or the like is generated as a reset signal is proposed (for example, refer to Japanese Patent Application Laid-Open (JP-A) No. 2008-187475). The power-on reset circuit generates a signal which has a logical level 1 (or 0) at which reset is prompted only during a period from when power is turned on until a delay time due to the above RC circuit elapses and which then remains in a state of a logical level 0 (or 1) at which reset release is prompted as a reset signal.

SUMMARY

Incidentally, in the above power-on reset circuit, although a delay time due to the RC circuit is fixed, a time from when power is turned on until a voltage value of the power supply voltage reaches a desired voltage value, that is, a so-called power supply voltage rise time significantly varies in some cases. Therefore, for example, when a power supply voltage rise time is longer than a delay time due to the RC circuit, there is a problem in which, before a power supply voltage supplied to a power-on reset target circuit reaches a desired voltage value, a reset signal transitions to a state in which reset release is prompted and power-on reset is not performed.

An object of the disclosure is to provide a semiconductor device capable of performing power-on reset reliably regardless of a length of a power supply voltage rise time when power is turned on and a method of generating a power-on reset signal.

A semiconductor device according to the disclosure includes a regulator configured to generate a regulated power supply voltage having a lower voltage value than a power supply voltage based on the power supply voltage and output the regulated power supply voltage to an internal power supply line; and a power-on reset circuit configured to generate a signal which has a first level at which reset is prompted immediately after power for the power supply voltage is turned on and which transitions to a second level at which reset release is prompted from the first level when a voltage value of the internal power supply line has risen as a power-on reset signal.

A method of generating a power-on reset signal according to the disclosure is a method of generating a power-on reset signal performed in a semiconductor device in which a regulator configured to output a regulated power supply voltage having a lower voltage value than a power supply voltage based on the power supply voltage to an internal power supply line is formed, the method of generating a power-on reset signal including generating a signal which has a first level at which reset is prompted immediately after power for the power supply voltage is turned on and which transitions to a second level at which reset release is prompted when a voltage value of the internal power supply line has risen as the power-on reset signal.

In the disclosure, a signal which has a first level at which reset is prompted immediately after a power supply voltage is applied and then transitions to a second level at which reset release is prompted when a voltage value of a regulated power supply voltage generated by the regulator that is utilizing the power supply voltage to operate has risen is generated as a power-on reset signal. Accordingly, after power is turned on, a circuit that receives the power supply voltage to operate is in an operable state, and the power-on reset signal transitions to the second level at which reset release is prompted from the first level at which reset is prompted. Thus, a circuit that is utilizing the power supply voltage to operate can be reset reliably in response to power-on regardless of a length of a power supply voltage rise time when power is turned on.

DESCRIPTION OF THE EMBODIMENTS

Figure 1:
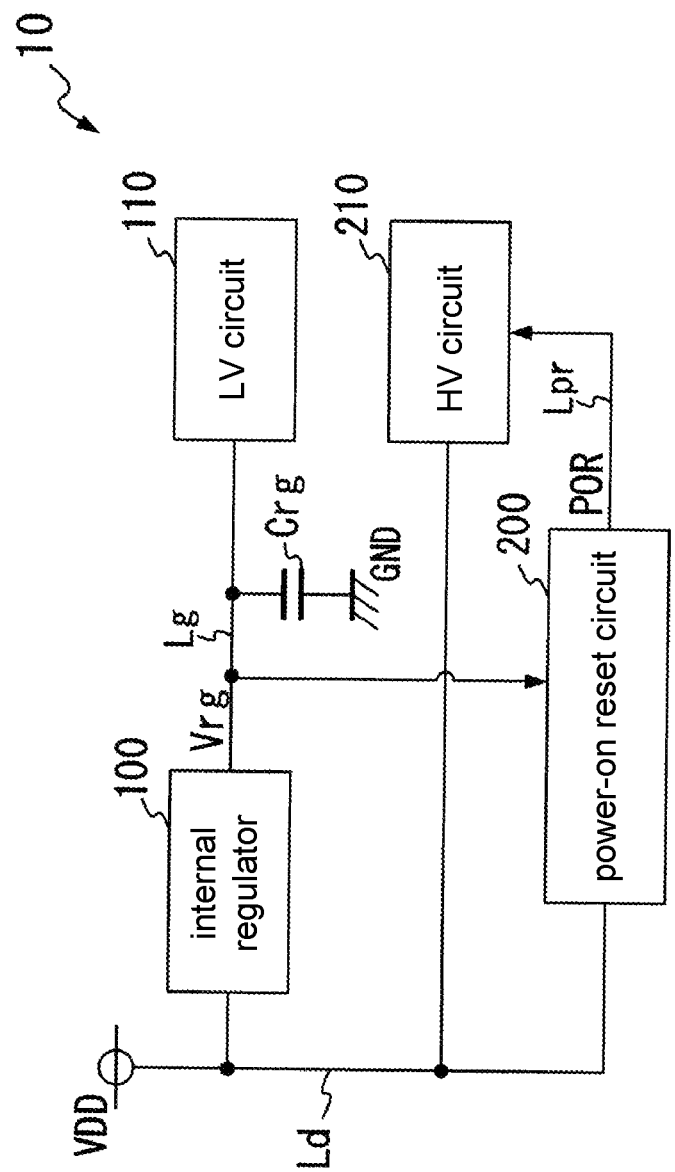
FIG. 1 is a block diagram illustrating a schematic configuration of a semiconductor integrated circuit (IC) chip 10.

FIG. 1 is a block diagram schematically illustrating a configuration of a semiconductor IC chip 10 as a semiconductor device. In FIG. 1, an internal regulator 100 generates a regulated power supply voltage Vrg having a voltage value that is lower than a power supply voltage VDD and having a constant voltage value based on the DC power supply voltage VDD received through a power supply line Ld. The internal regulator 100 supplies the generated regulated power supply voltage Vrg to a power-on reset circuit 200 and a low power supply driven circuit 110 (hereinafter referred to as the LV circuit 110) that is utilizing the regulated power supply voltage Vrg to operate through an internal power supply line Lg. A bypass capacitor Crg for preventing power supply fluctuation is connected to the internal power supply line Lg. In addition, a high power supply driven circuit 210 (herein referred to as the HV circuit 210) that is utilizing the power supply voltage VDD to operate is provided in the semiconductor IC chip 10 as a circuit that functions as the semiconductor IC chip 10 in addition to the above LV circuit 110.

The power-on reset circuit 200 generates a power-on reset signal POR for resetting an operation of the HV circuit 210 when power is turned on based on the power supply voltage VDD and the regulated power supply voltage Vrg and supplies the power-on reset signal POR to the HV circuit 210.

Figure 2:
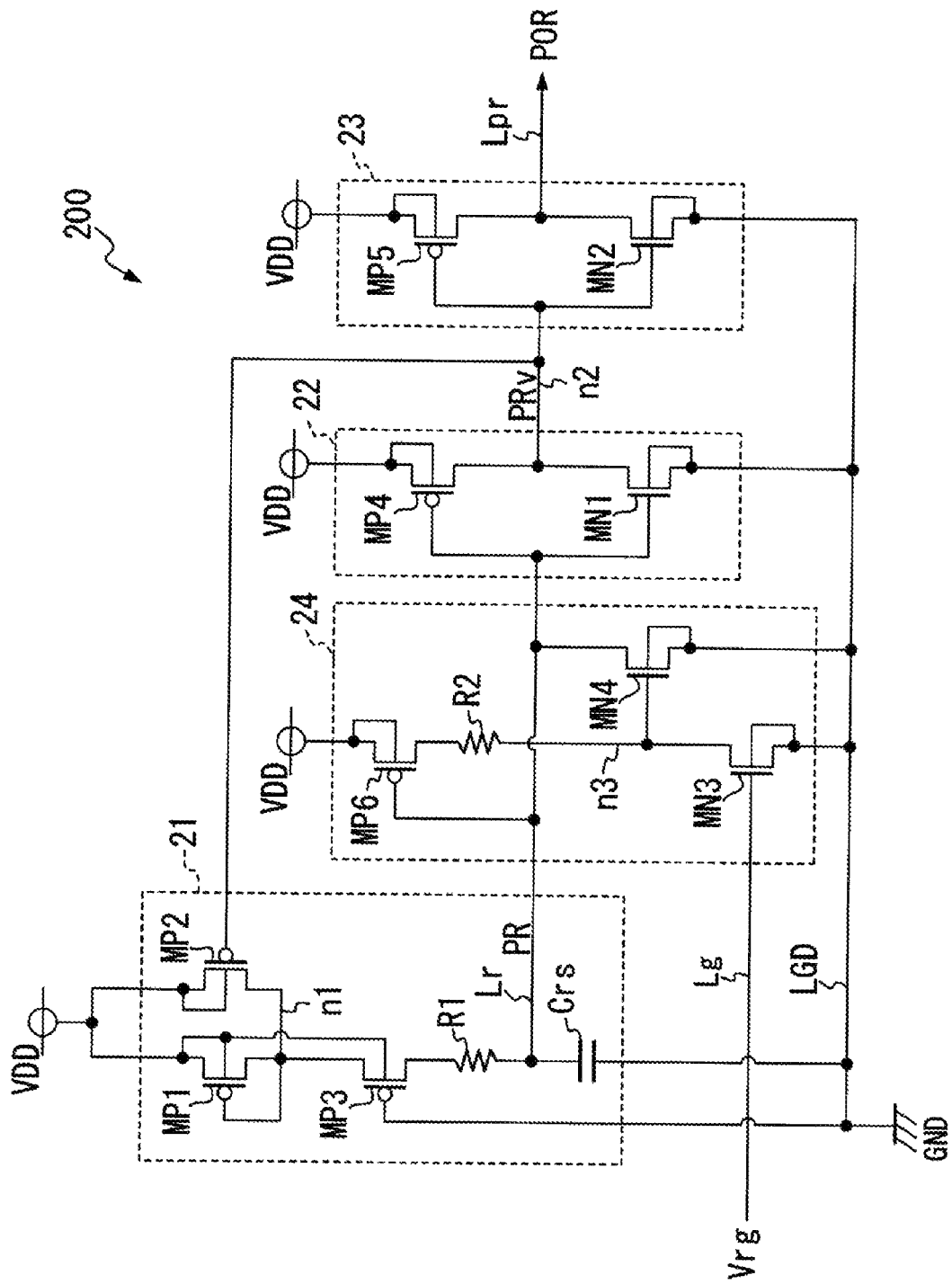
FIG. 2 is a circuit diagram illustrating an example of a circuit configuration of a power-on reset circuit 200.

FIG. 2 is a circuit diagram illustrating an example of a circuit configuration of the power-on reset circuit 200. As illustrated in FIG. 2, the power-on reset circuit 200 includes a delay circuit 21, inverters 22 and 23, and a reset release timing control circuit 24.

The delay circuit 21 includes p-channel MOS type transistors MP1 to MP3, a resistor R1, and a capacitor Crs. A power supply voltage VDD is supplied to a source terminal and a back gate of the transistor MP1, and a gate terminal and a drain terminal of the transistor MP1 are both connected to a node n1. That is, the transistor MP1 is diode-connected between the power supply line Ld and the node n1 which receive the power supply voltage VDD. A power supply voltage VDD is supplied to a source terminal and a back gate of the transistor MP2, and a drain terminal of the transistor MP2 is connected to the above node n1. In addition, an inverted power-on reset signal PRv is supplied to a gate terminal of the transistor MP2. A source terminal of the transistor MP3 is connected to the above node n1, and a gate terminal of the transistor MP3 is connected to a ground line LGD. Here, for example, a zero volts ground potential GND is applied to the ground line LGD. In addition, a power supply voltage VDD is supplied to a back gate of the transistor MP3, and one end of the resistor R1 for current limitation is connected to a drain terminal of the transistor MP3. The other end of the resistor R1 is connected to one end of the capacitor Crs through a reset signal line Lr. The other end of the capacitor Crs is connected to the ground line LGD. Here, as the capacitor Crs, a capacitor utilizing a gate capacitance or a drain capacitance of a MOS transistor can be used.

According to the above configuration, the delay circuit 21 generates a signal obtained by delaying a voltage value of the power supply voltage VDD received through the power supply line Ld according to a time constant based on turned-on resistances of the capacitor Crs and the transistors MP1 to MP3 as a power-on reset signal PR. The delay circuit 21 supplies the power-on reset signal PR to the inverter 22 and the reset release timing control circuit 24 through the reset line Lr.

The inverter 22 includes a p-channel MOS type transistor MP4 and an n-channel MOS type transistor MN1. A power supply voltage VDD is supplied to a source terminal and a back gate of the transistor MP4, and a drain terminal of the transistor MP4 is connected to a node n2. A drain terminal of the transistor MN1 is connected to the node n2, and a source terminal and a back gate of the transistor MN1 are connected to the ground line LGD. The power-on reset signal PR is supplied to gate terminals of the transistors MP4 and MN1.

In such a configuration, when a voltage of the above power-on reset signal PR is a predetermined value or more, the inverter 22 generates a signal having a ground potential GND corresponding to a logical level 0 as the above inverted power-on reset signal PRv. On the other hand, when a potential of the power-on reset signal PR is lower than the predetermined value, the inverter 22 generates a signal having a power supply voltage VDD corresponding to a logical level 1 as the above inverted power-on reset signal PRv. The inverter 22 supplies the above inverted power-on reset signal PRv to the next stage inverter 23 and the gate terminal of the transistor MP2 of the delay circuit 21 through the node n2.

The inverter 23 includes a p-channel MOS type transistor MP5 and an n-channel MOS type transistor MN2. A power supply voltage VDD is supplied to a source terminal and a back gate of the transistor MP5, and a drain terminal of the transistor MP5 is connected to the reset signal output line Lpr. A drain terminal of the transistor MN2 is connected to a reset signal output line Lpr, and a source terminal and a back gate of the transistor MN2 are connected to the ground line LGD. The inverted power-on reset signal PRv is supplied to gate terminals of the transistors MP5 and MN2.

In such a configuration, the inverter 23 generates a signal obtained by inverting a logical level of the inverted power-on reset signal PRv as the power-on reset signal POR. The inverter 23 supplies the power-on reset signal POR to the HV circuit 210 through the reset signal output line Lpr.

The reset release timing control circuit 24 includes a p-channel MOS type transistor MP6, n-channel MOS type transistors MN3 and MN4, and a resistor R2. A power supply voltage VDD is supplied to a source terminal and a back gate of the transistor MP6, and a power-on reset signal PR is supplied to a gate terminal of the transistor MP6 through the reset line Lr. In addition, one end of the resistor R2 for current limitation is connected to a drain terminal of the transistor MP6. A drain terminal of the transistor MN3 and a gate terminal of the transistor MN4 are connected to the other end of the resistor R2 through a node n3. A source terminal and a back gate of the transistor MN3 are connected to the ground line LGD, and the regulated power supply voltage Vrg is supplied to a gate terminal of the transistor MN3 through the reset line Lg. A source terminal and a back gate of the transistor MN4 are connected to the ground line LGD, and a drain terminal of the transistor MN4 is connected to the reset line Lr. In addition, the resistors R1 and R2 provided for current limitation can be omitted.

In such a configuration, the transistor MP6 supplies the power supply voltage VDD to the node n3 when a voltage value of the reset line Lr is lower than a predetermined value. The transistor MN3 is turned on when a voltage value of the internal power supply line Lg having received the supply of the regulated power supply voltage Vrg is a predetermined value or more and connects the node n3 to the ground line LGD. The transistor MN4 is turned on when a voltage value of the node n3 is a predetermined value or more, and connects the reset line Lr to the ground line LGD.

In addition, when the power supply voltage VDD is a high voltage (for example, 20 volts), a high breakdown voltage type MOS transistor is used as the transistors MP1 to MP6 and MN1 to MN4.

Operations of the power-on reset circuit 200 including the reset release timing control circuit 24 illustrated in FIG. 2 will be described below with reference to a time chart illustrated in FIG. 3. In addition, FIG. 3 illustrates an operation when the power-on reset circuit 200 receives a power supply voltage VDD of which a voltage value gradually increases in response to power-on from a power-on time t0 and reaches a desired voltage value vd after a power supply rise time TP elapses.

Figure 3:
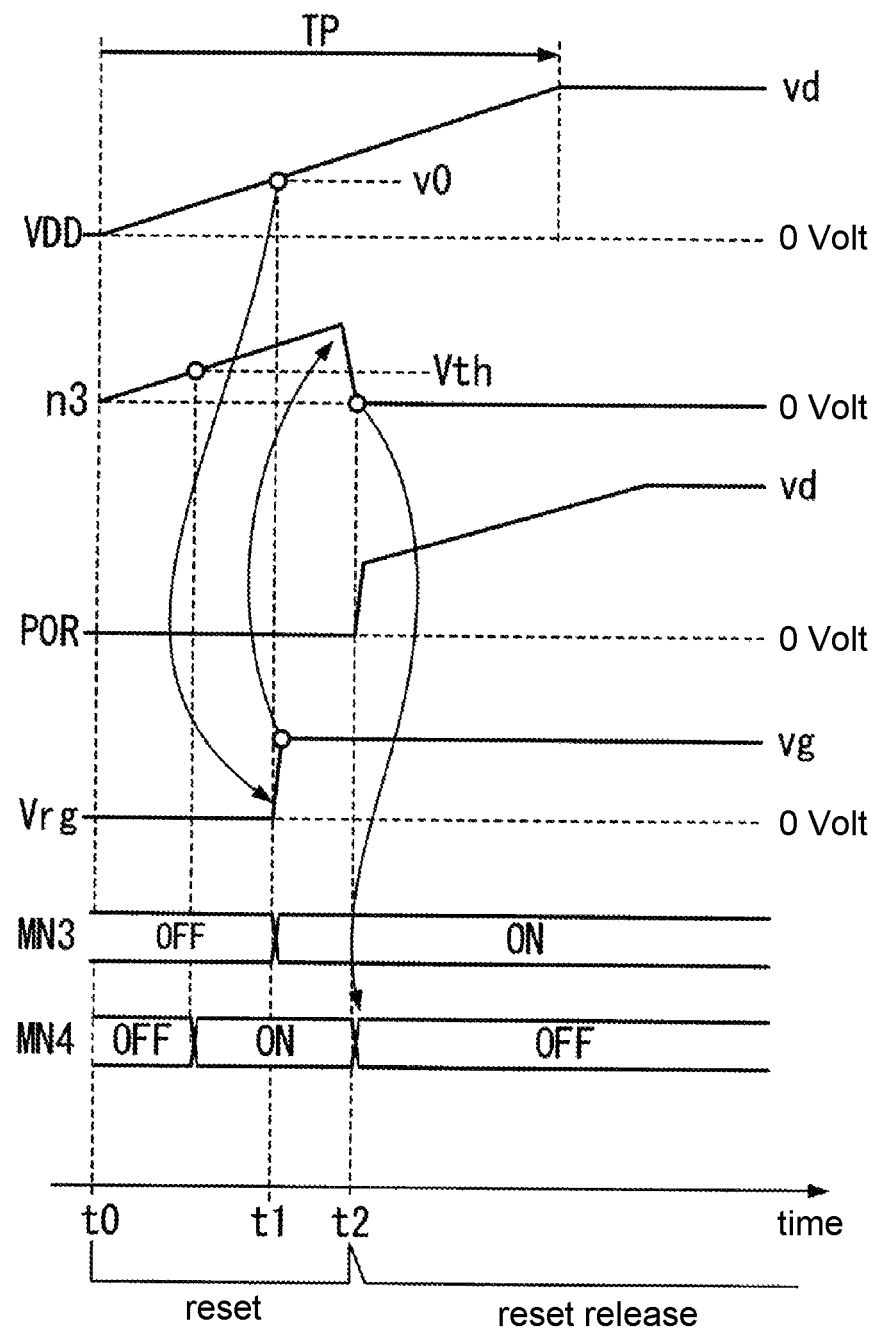
FIG. 3 is a time chart illustrating an exemplary operation of the power-on reset circuit 200.

As illustrated in FIG. 3, after power is turned on, when a voltage value of the power supply voltage VDD reaches the lowest voltage value v0 at which the internal regulator 100 can operate, the internal regulator 100 starts an operation at a time t1 at which the voltage value reaches v0, and a voltage value of the regulated power supply voltage Vrg rises. That is, as illustrated in FIG. 3, the regulated power supply voltage Vrg having remained in a zero volts state from the power-on time t0 to the time t1 rises at the time t1 and reaches a desired voltage value vg.

Here, the power-on reset signal PR generated in the delay circuit 21 has a voltage transition in which a rising waveform of the power supply voltage VDD illustrated in FIG. 3 is delayed. Therefore, from the power-on time t0 to the time t1 illustrated in FIG. 3, a voltage value of the power-on reset signal PR is lower than a voltage value of the power supply voltage VDD, and during this time, the transistor MP6 of the reset release timing control circuit 24 is turned on. In addition, since a voltage value of the power supply voltage VDD is low from the time t0 to the time t1, the internal regulator 100 is an inoperable state. Therefore, as illustrated in FIG. 3, a voltage value of the regulated power supply voltage Vrg is maintained at zero volts. Accordingly, during this time (t0 to t1), the transistor MN3 of the reset release timing control circuit 24 is turned off. Thus, the node n3 of the reset release timing control circuit 24 is charged by the power supply voltage VDD applied through the transistor MP6 and the resistor R2, and a voltage of the node n3 increases as illustrated in FIG. 3. At this time, when a voltage value of the node n3 is greater than a threshold voltage Vth of the transistor MN4 of the reset release timing control circuit 24, the transistor MN4 is turned on, and a potential of the reset line Lr is set to the ground potential GND. Accordingly, since the on state of the transistor MP6 is maintained, charging to the node n3 continues, and a voltage value of the node n3 increases. Then, at the time t1, the internal regulator 100 starts generation of the regulated power supply voltage Vrg, and as a result, when a voltage value of the internal power supply line Lg is a predetermined value or more, the transistor MN3 transitions to an on state.

Accordingly, since the ground potential GND is applied to the node n3, a voltage of the node n3 decreases. Then, at the time t2 illustrated in FIG. 3, when a voltage value of the node n3 reaches zero volts, the transistor MN4 transitions from an on state to an off state, and the reset line Lr is released from the ground line LGD. Therefore, after the time t2, the power-on reset signal POR having a waveform corresponding to the power-on reset signal PR sent from the delay circuit 21 appears in the reset line Lr.

Here, a period (t0 to t2) in which a voltage value of the power-on reset signal POR is in a zero volts state is a reset period in which reset is prompted to the above HV circuit 210 and a period after the time t2 is a reset release period in which reset release is prompted.

As described above, the reset release timing control circuit 24 transitions the power-on reset signal POR to a state in which reset release is prompted using a rise time of a voltage value of the regulated power supply voltage Vrg after power is turned on as a starting point. In addition, since the internal regulator 100 belongs to an HV circuit that is utilizing the power supply voltage VDD to operate, the fact that the regulated power supply voltage Vrg generated from the internal regulator 100 has risen at the time t1 means that the HV circuit 210 is also in an operable state at the time t1.

Therefore, according to the power-on reset signal POR, after power is turned on, the HV circuit 210 is reset after the HV circuit 210 is in an operable state, that is, after the time t1. Then, after the HV circuit 210 is reset, the power-on reset signal POR transitions to a high level (VDD) state in which reset release is prompted at the time t2. Therefore, regardless of the length of the power supply rise time TP of the power supply voltage VDD, the HV circuit 210 that is utilizing the power supply voltage VDD to operate can be reliably power-on reset.

Figure 4:
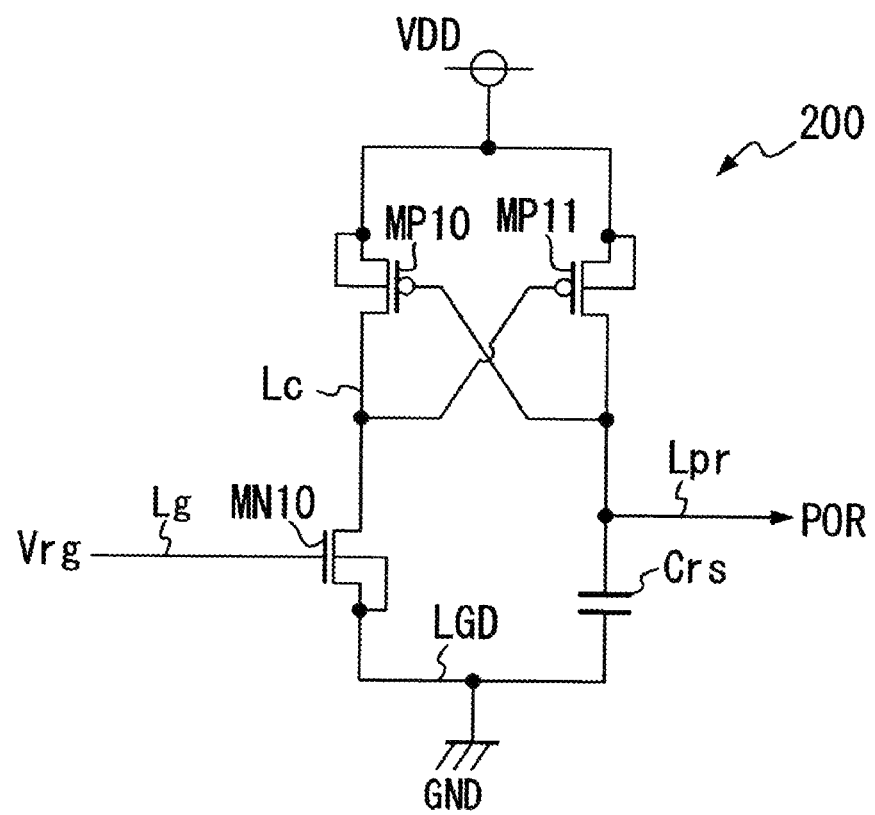
FIG. 4 is a circuit diagram illustrating another circuit configuration of the power-on reset circuit 200.

In addition, a circuit configuration illustrated in FIG. 4 may be used for the power-on reset circuit 200 in place of the circuit configuration illustrated in FIG. 2.

The power-on reset circuit 200 in FIG. 4 includes p-channel MOS type transistors MP10 and MP11, an n-channel MOS type transistor MN10 as a reset release timing control unit, and a capacitor Crs. In addition, when the power supply voltage VDD is a high voltage (for example, 20 volts), a high breakdown voltage type MOS transistor is used as the transistors MP10, MP11 and MN10. Here, as the capacitor Crs, a capacitor utilizing a gate capacitance or a drain capacitance of a MOS transistor can be used.

A power supply voltage VDD is supplied to a source terminal and a back gate of the transistor MP10, and a drain terminal of the transistor MP10 is connected to a drain terminal of the transistor MN10 and a gate terminal of the transistor MP11 through a control line Lc. A gate terminal of the transistor MP10 is connected to a drain terminal of the transistor MP11, the reset signal output line Lpr, and one end of the capacitor Crs. The other end of the capacitor Crs is connected to a ground line LGD. In such a configuration, the transistor MP10 is turned on when a voltage value of the reset signal output line Lpr is lower than a predetermined value, and supplies the power supply voltage VDD to the control line Lc. Thus, the control line Lc is charged, and a potential of the control line Lc increases.

A power supply voltage VDD is supplied to a source terminal and a back gate of the transistor MP11, and a gate terminal is connected to the control line Lc. In such a configuration, the transistor MP11 is turned on when a voltage value of the control line Lc is lower than a predetermined value and supplies the power supply voltage VDD to the reset signal output line Lpr. Thus, the reset signal output line Lpr is charged, and a potential of the reset signal output line Lpr increases.

The regulated power supply voltage Vrg generated from the internal regulator 100 is supplied to a gate terminal of the transistor MN10, and a source terminal and a back gate are connected to the ground line LGD. In such a configuration, the transistor MN10 is turned on when a voltage value of the internal power supply line Lg, that is, a voltage value of the regulated power supply voltage Vrg, is a threshold voltage or more, and connects the control line Lc to the ground line LGD.

Here, in the power-on reset circuit 200 illustrated in FIG. 4, the control line Lc and the reset signal output line Lpr are formed in the semiconductor IC chip 10 in a manner that an electrostatic capacitance of the reset signal output line Lpr including its own parasitic capacitance is larger than an electrostatic capacitance parasitic on the control line Lc.

Therefore, when a voltage value of the power supply voltage VDD increases from zero volts in response to power-on, that is, when a voltage value of the power supply voltage VDD rises, first, a voltage value of the control line Lc increases as the power supply voltage VDD increases. Thus, immediately after power is turned on, the transistor MP11 is turned off, and a voltage value of the reset signal output line Lpr, that is, a voltage value of the power-on reset signal POR is maintained at a zero volts state in which reset is prompted as illustrated in FIG. 3. Then, as the power supply voltage VDD increases, when a voltage value thereof reaches a voltage value v0 at which the internal regulator 100 is operable at the time t1 illustrated in FIG. 3, the internal regulator 100 starts to operate. At this time, the internal regulator 100 outputs the regulated power supply voltage Vrg to the internal power supply line Lg. Here, when a voltage value of the internal power supply line Lg is a predetermined value or more, the transistor MN10 illustrated in FIG. 4 is turned on, and a potential of the control line Lc becomes the ground potential GND. Therefore, the transistor MP11 is turned on, and the power supply voltage VDD is supplied to the capacitor Crs through the reset signal output line Lpr. At this time, the capacitor Crs is charged, and accordingly, a voltage value of the reset signal output line Lpr, that is, a voltage value of the power-on reset signal POR increases. That is, a voltage value of the power-on reset signal POR transitions to a state in which reset release is prompted.

In this manner, in the configuration illustrated in FIG. 4 also, similarly to the power-on reset circuit 200 illustrated in FIG. 2, regardless of the length of the power supply rise time TP of the power supply voltage VDD, after power is turned on, the power-on reset signal POR transitions to a state in which reset release is prompted after the HV circuit 210 is in an operable state. Thus, the HV circuit 210 that is utilizing the power supply voltage VDD to operate can be reliably power-on reset.

In short, as a semiconductor device 10 according to the disclosure, a device in which a regulator 100 configured to generate a regulated power supply voltage Vrg having a constant voltage value vg lower than a power supply voltage based on the power supply voltage VDD and output the regulated power supply voltage Vrg to an internal power supply line Lg and the following power-on reset circuit are provided may be used. That is, the power-on reset circuit 200 generates a signal which has a first level at which reset is prompted immediately after the power supply voltage VDD is turned on and which transitions to a second level at which reset release is prompted from the first level at t1 when a voltage value of the internal power supply line Lg has risen as a power-on reset signal POR.

What is claimed is:

1. A semiconductor device comprising:
    a regulator configured to generate a regulated power supply voltage having a lower voltage value than a power supply voltage based on the power supply voltage and output the regulated power supply voltage to an internal power supply line;
    a power-on reset circuit configured to generate a signal which is maintained at a first level at which reset is prompted since an instant when power for the power supply voltage is turned on and which transitions to a second level at which reset release is prompted from the first level when a voltage value of the internal power supply line has risen as a power-on reset signal;
    a first circuit, configured to operate by receiving the regulated power supply voltage; and
    a second circuit, configured to operate by receiving the power supply voltage,
    wherein the power-on reset circuit is configured to supply the power-on reset signal to the second circuit and reset the second circuit when power is turned on.

2. A semiconductor device comprising:
    a regulator configured to generate a regulated power supply voltage having a lower voltage value than a power supply voltage based on the power supply voltage and output the regulated power supply voltage to an internal power supply line; and
    a power-on reset circuit configured to generate a signal which has a first level at which reset is prompted after power for the power supply voltage is turned on and which transitions to a second level at which reset release is prompted from the first level when a voltage value of the internal power supply line has risen as a power-on reset signal, wherein the power-on reset circuit comprises:
    a power supply line through which the power supply voltage is received,
    a delay circuit configured to delay a voltage value of the power supply line by a predetermined period and supply the delayed voltage value to a reset line,
    a circuit configured to output a signal which has the first level when a voltage value of the reset line is lower than a predetermined value and has the second level when a voltage value of the reset line is the predetermined value or more as the power-on reset signal,
    a first switch element that is turned on when a voltage value of the reset line is lower than the predetermined value and supplies the power supply voltage to a first node,
    a second switch element that is turned on when a voltage value of the internal power supply line is the predetermined value or more and connects the first node to a ground line, and
    a third switch element that is turned on when a voltage value of the first node is the predetermined value or more and connects the reset line to the ground line.

3. The semiconductor device according to claim 1, wherein the power-on reset circuit comprises:
    a control line,
    a reset signal output line having a larger electrostatic capacitance than the control line has,
    a first switch element that is turned on when a voltage value of the reset signal output line is lower than a predetermined value and supplies the power supply voltage to the control line,
    a second switch element that is turned on when a voltage value of the control line is lower than the predetermined value and supplies the power supply voltage to the reset signal output line, and
    a third switch element that is turned on when a voltage value of the internal power supply line is the predetermined value or more and connects the control line to a ground line.

4. A method of generating a power-on reset signal performed in a semiconductor device comprising a regulator configured to output to an internal power supply line a regulated power supply voltage having a lower voltage value than a power supply voltage based on the power supply voltage, a first circuit, configured to operate by receiving the regulated power supply voltage, and a second circuit configured to operate by receiving the power supply voltage, the method of generating the power-on reset signal comprising:
    generating a signal which is maintained a first level at which reset is prompted since an instant when power for the power supply voltage is turned on and which transitions to a second level at which reset release is prompted when a voltage value of the internal power supply line has risen as the power-on reset signal; and
    supplying the power-on reset signal to the second circuit and resetting the second circuit when power is turned on.

* * * * *